United States Patent [19]

Heard

[11] Patent Number: 4,797,640

[45] Date of Patent: Jan. 10, 1989

[54] APPARATUS FOR AMPLITUDE MODULATING THE OUTPUT OF A LASER DIODE OR L.E.D.

[75] Inventor: Maurice C. Heard, Hullbridge, United Kingdom

[73] Assignee: The General Electric Company, p.l.c., London, England

[21] Appl. No.: 896,273

[22] Filed: Aug. 14, 1986

[30] Foreign Application Priority Data

Aug. 21, 1985 [GB] United Kingdom ................ 8520923

[51] Int. Cl.⁴ ............................................. H04B 9/00
[52] U.S. Cl. ................................................ 332/7.51
[58] Field of Search ...................... 332/7.51; 455/613; 372/31

[56] References Cited

U.S. PATENT DOCUMENTS

| | | | |
|---|---|---|---|
| 3,280,332 | 10/1966 | Yando | 455/613 |
| 3,341,708 | 9/1967 | Bilderback | 372/31 X |
| 3,551,848 | 7/1970 | Rossoff | 332/7.51 |
| 3,988,704 | 10/1976 | Rice et al. | 332/7.51 |
| 3,996,526 | 12/1976 | d'Auria et al. | 372/31 |
| 4,074,143 | 2/1978 | Rokos | 372/31 X |
| 4,101,847 | 7/1978 | Albanese | 372/31 |
| 4,149,071 | 4/1979 | Nagai et al. | 332/7.51 X |
| 4,277,846 | 7/1981 | Chen | 455/613 X |
| 4,580,293 | 4/1986 | Reichle | 455/613 X |
| 4,611,352 | 9/1986 | Fujito et al. | 372/31 X |

OTHER PUBLICATIONS

Myers, "The Radio Amateur's Handbook" The American Radio Relay League Inc., 1973, p. 39.

*Primary Examiner*—Thomas H. Tarcza
*Assistant Examiner*—Mark Hellner
*Attorney, Agent, or Firm*—Spencer & Frank

[57] ABSTRACT

The output of a laser diode or L.E.D. is amplitude modulated by varying the forward current through it. This is done by applying a dc current component from a first current source and an ac current component from another part of the circuit. The ac current component is applied to the laser diode or L.E.D. via an ideal impedance matching transformer which includes the internal capacitance of the laser diode or L.E.D, such that when the frequency of the modulating signal is varied, and hence the response of the laser diode or L.E.D varies, ideal matching is still obtained since the internal capacitance enables compensation to be made.

1 Claim, 1 Drawing Sheet

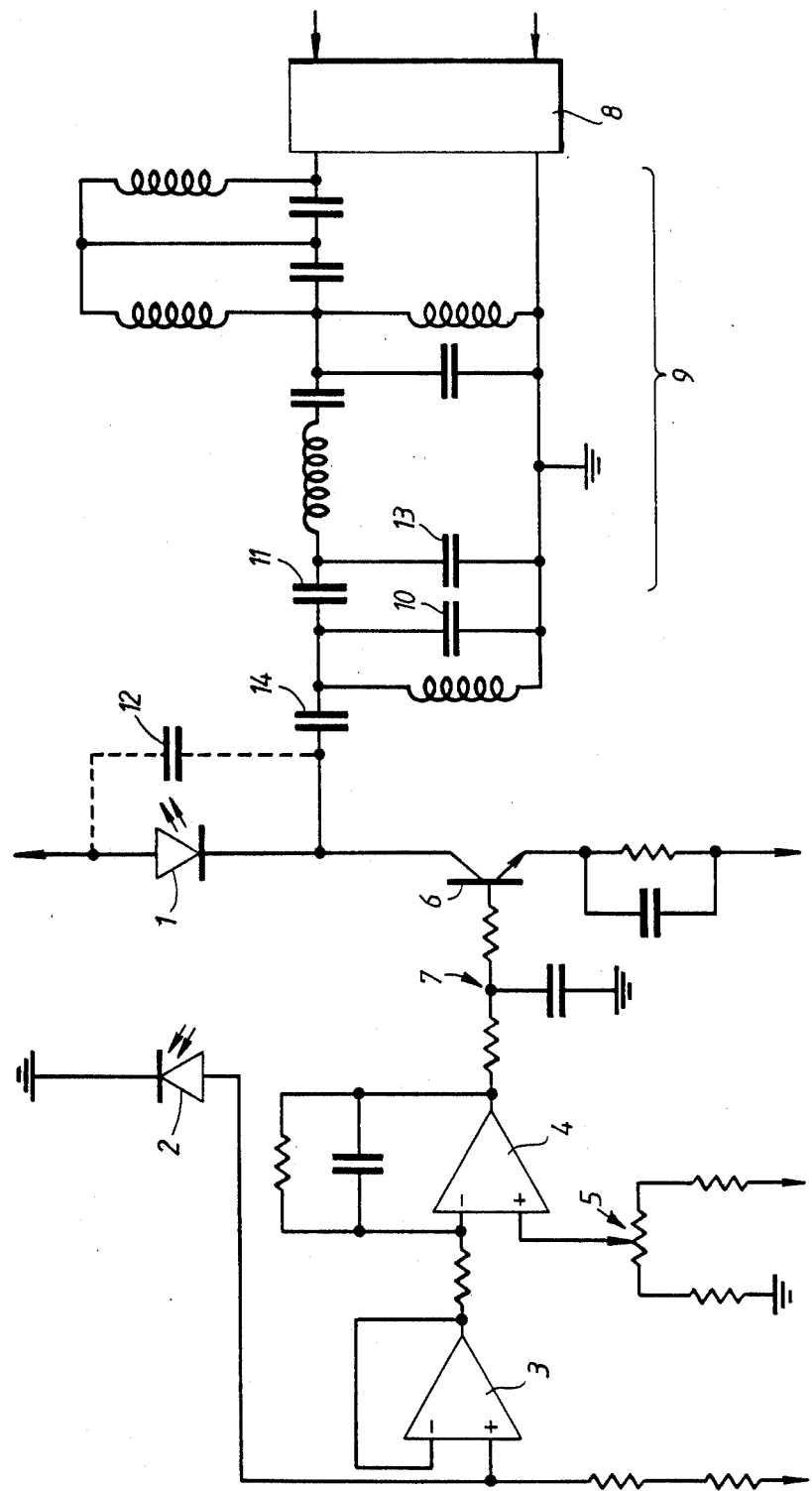

APPARATUS FOR AMPLITUDE MODULATING THE OUTPUT OF A LASER DIODE OR L.E.D.

FIELD OF THE INVENTION

This invention relates to apparatus for amplitude modulating the output of a laser diode or L.E.D (light emitting diode) and is particularly, but not exclusively, suitable for optical communication applications.

BACKGROUND OF THE INVENTION

A laser diode is a semiconductor device in which, when its p-n junction is sufficiently forward biased, holes and electrons recombine and photons are emitted. Above a threshold current stimulated emission can occur, resulting in a directional beam of coherent output radiation. The wavelength of the output radiation depends upon the dimensions of the laser diode. The amplitude of the output radiation depends on the magnitude of the forward current. Thus by altering the forward current through the laser diode, modulation of the power output of the diode may be achieved. There is an upper limit to the current which may be applied to the laser diode which, if exceeded, may cause excessive heating and could result in its destruction.

The threshold current is temperature dependent and thus the output power may vary even when the forward current through the diode is constant, with variation in external and internal temperatures. This can cause problems when it is wished to modulate the power output for data communication. Similar considerations apply to L.E.Ds, although in this case the threshold level is not precisely defined, but may be taken to be the lowest level at which a useful light output is produced.

One way in which compensation for the thermal instability of the threshold current may be achieved is to sample the output of a laser diode using a photodiode to provide a feedback signal to control the forward current. However, this solution is not suitable where it is desired to amplitude modulate the laser diode output at a reasonably high frequency, for example, where the laser diode is used in an optical communication arrangement.

In a previous method for attempting to overcome the problem of thermal stability while still being able to amplitude modulate the laser diode at a sufficiently high frequency, the current through the laser consists of two components. One component, known as the center point current, is arranged to forward bias the laser diode to a center point approximately midway between the threshold current and the current giving a maximum safe output power at a given temperature. This component is made to vary with diode junction temperature, by using a photodiode to give a feedback control signal, thus enabling it to remain at the midpoint. The other current is known as the modulating current and, when combined with the centre point current, enables the output of the laser diode to vary from the threshold condition to a maximum safe output.

SUMMARY OF THE INVENTION

The present invention seeks to provide improved apparatus for amplitude modulation of a laser diode or L.E.D output.

According to this invention, there is provided apparatus for amplitude modulating the output of a laser diode or L.E.D comprising means for applying to the laser diode or L.E.D a forward current including a substantially constant current component from a first current source, and a varying current component representing a modulating signal from another current source, the varying current component being applied to the laser diode or L.E.D via an impedance matching transformer which includes the internal capacitance of the laser diode or L.E.D. The substantially constant current component may be varied as temperature changes occur but these are relatively slow, and it may be thus considered a dc current. By employing the invention, the dc current may be derived from a circuit arranged to give optimum dc characteristics, and the varying or ac current component from a circuit arranged to give optimum ac characteristics, whereas previously a circuit had to be designed to give characteristics which were a compromise between dc and ac operation. The characteristics of both laser diodes and L.E.Ds are frequency dependent, and vary with the frequency of the modulating signal. By incorporating the internal capacitance of the laser diode or L.E.D in the impedance matching transformer, inherent compensation for these variations in characteristics may be achieved. The impedance matching transformer may be arranged to be ideal to give substantially lossless operation.

BRIEF DESCRIPTION OF DRAWING

One way in which the invention may be performed is now described by way of example with reference to the accompanying drawing in which the sole figure illustrates apparatus in accordance with the invention.

DESCRIPTION OF PREFEFFED EMBODIMENT

With reference to the Figure, an optical communication arrangement includes a laser diode 1 which is driven such that its output power is amplitude modulated for the transmission of data, the magnitude of the output power being determined by the magnitude of the forward current through the diode 1. The forward current may be regarded as having two components. One component is a dc current maintained at a value to give an output power approximately midway between the power at the threshold current and the maximum safe power output. The other is an ac current and controls the amplitude modulation of the output of the diode 1 to impose on it information to be transmitted. The dc component of the forward current is derived from the left hand side of the circuit as shown in the Figure, and the ac component from the right hand side.

Considering first the dc component, a photodiode 2 is arranged to receive a proportion of the output light of the laser diode 1, the output power of which varies with the varying ac modulating part of the current, and with changes in temperature at the p-n junction of the diode 1 due to internal and external heating effects.

The photodiode 2 generates a current which is dependent on the intensity of the light it detects and, since it is less frequency responsive than the diode 1 at relatively high frequencies, the current tends not to be dependent on the ac component to any great extent, although it is representative of the slower changes due to temperature variation.

The output of the photodiode 2 is applied to a transimpedance buffer amplifier 3 having unity gain, which converts the current into a voltage.

The output of the buffer amplifier 3 is applied to the inverting input of an operational amplifier 4, where it is compared with a reference voltage set by adjusting a potentiometer 5. Thus if the output power decreases, because of a rise in the junction temperature, then a smaller current is derived from the photodiode 2. Thus a smaller voltage is compared with the reference voltage at the amplifier 4 and hence there is a larger difference between them and the voltage at the output of the amplifier 4 is increased. The output of the amplifier 4 is applied to a transistor 6 via a low pass filter section 7 which cuts out any transients and variations due to the ac modulating current. If, as in the case described, the voltage is increased, the forward current through the diode 1, which is derived from the transistor 6, is also increased. This causes the output power of the diode 1 to rise until it reaches the desired midway between the power output at the threshold current and the maximum safe power output. If the output power of the laser diode 1 rises for a given forward current the left hand side of the circuit acts to compensate for this and reduces the forward current through the diode 1. Thus the left hand side of the circuit effectively acts as a feedback circuit to maintain the dc current at a value which results in a power output at the midpoint value.

The varying current component through the laser diode 1 representing the modulating signal is derived from the right hand side of the circuit as shown. A modulating radio frequency signal is applied to a broad band amplifier 8. The output of the amplifier 8 is transmitted via a band pass filter network 9 to an impedance transformer comprising four capacitors 10, 11, 12 and 13. One of these capacitors 12 is the internal capactance of the laser diode 1 and is shown in the Figure as a broken line in parallel with it. The four capacitors 10, 11, 12 and 13 together form an ideal impedance transformer and provide perfect matching of the diode laser 1 and the filter network 9 at a particular frequency. As the frequency of the current applied to the diode 1 varies, the characteristics of the diode laser 1 also vary.

Since the impedance transformer also includes the internal capacitance 12 of the diode 1 it correspondingly varies with the frequency of the modulating signal and thus enables the matching to remain ideal at any frequency. A blocking capacitor 14 is included to prevent d.c current entering the filter network 9.

I claim:

1. Apparatus for generating an amplitude modulated optical signal in response to an input modulating signal comprising a light emitting diode having a forward conducting direction and an internal capacitance, said light emitting diode emitting light when a current flows therethrough in said forward conducting direction;

a first current source including a photodiode receiving light from said light emitting diode, a comparator coupled to the output of said photodiode and a transistor having its colletor-emitter path connected in series with said light emitting diode and its base connected to the output of said comparator, said comparator comparing the output of said photodiode with a reference signal to generate a substantially constant current component of the forward direction current through said light emitting diode; and a second current source including a broad band amplifier, a filter network and an impedance transformer coupling said input modulating signal to said light emitting diode to generate a varying current component of said forward direction current, said impedance matching transformer comprising the internal capacitance of said light emitting diode and capacitive elements only, whereby substantially ideal impedance matching between said filter network and said light emitting diode is obtained for all frequencies of said input modulating signal.

* * * * *